(12) United States Patent
Momota et al.

(10) Patent No.: US 12,211,757 B2
(45) Date of Patent: Jan. 28, 2025

(54) SEMICONDUCTOR DEVICE AND METHOD OF FORMING THE SAME

(71) Applicant: MICRON TECHNOLOGY, INC., Boise, ID (US)

(72) Inventors: Haruka Momota, Sagamihara (JP); Koji Yasumori, Machida (JP); Keizo Kawakita, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 274 days.

(21) Appl. No.: 17/550,741

(22) Filed: Dec. 14, 2021

(65) Prior Publication Data

US 2023/0187289 A1   Jun. 15, 2023

(51) Int. Cl.
| | | |
|---|---|---|
| H01L 23/58 | (2006.01) | |
| H01L 21/66 | (2006.01) | |
| H01L 21/768 | (2006.01) | |
| H01L 23/525 | (2006.01) | |
| H01L 23/528 | (2006.01) | |
| H01L 29/10 | (2006.01) | |
| H10B 12/00 | (2023.01) | |

(52) U.S. Cl.
CPC ........ *H01L 22/32* (2013.01); *H01L 21/76802* (2013.01); *H01L 23/5256* (2013.01); *H01L 23/528* (2013.01); *H10B 12/50* (2023.02)

(58) Field of Classification Search
CPC ................................ H01L 22/32; H01L 22/34
See application file for complete search history.

(56) References Cited

U.S. PATENT DOCUMENTS

| 8,704,223 | B2 * | 4/2014 | Yamagami | .............. | H01L 22/34 |
| | | | | | 257/789 |
| 2004/0262768 | A1 * | 12/2004 | Cho | ...................... | H01L 23/585 |
| | | | | | 257/E23.15 |
| 2007/0172966 | A1 * | 7/2007 | Hyde | ................. | G01R 31/2884 |
| | | | | | 438/14 |
| 2010/0264414 | A1 * | 10/2010 | Homma | .................. | H01L 24/06 |
| | | | | | 257/E21.531 |
| 2011/0260747 | A1 * | 10/2011 | Kameda | ............. | G01R 31/2884 |
| | | | | | 327/540 |
| 2011/0266541 | A1 * | 11/2011 | Yang | .................... | H01L 27/0203 |
| | | | | | 257/E23.01 |
| 2012/0018726 | A1 * | 1/2012 | Nakagawa | .............. | H01L 22/32 |
| | | | | | 257/E21.59 |
| 2012/0242402 | A1 * | 9/2012 | Seta | ........................ | H01L 22/32 |
| | | | | | 257/E23.179 |
| 2012/0313094 | A1 * | 12/2012 | Kato | ..................... | H01L 23/585 |
| | | | | | 257/E21.531 |

(Continued)

*Primary Examiner* — Kretelia Graham
*Assistant Examiner* — David J Goodwin
(74) *Attorney, Agent, or Firm* — Dorsey & Whitney LLP

(57) ABSTRACT

An apparatus includes an active region; a scribe region surrounding the active region; a test component in the scribe region; a pad electrode in the active region; and a power supply wiring of an upper wiring layer in the active region, the power supply wiring extending between the test component and the pad electrode; and an interconnection structure coupling the test component and the pad electrode across a border between the active region and the scribe region, the interconnection structure including a wiring portion of a lower wiring layer crossing the power supply wiring.

18 Claims, 17 Drawing Sheets

(56) References Cited

U.S. PATENT DOCUMENTS

| | | | |
|---|---|---|---|
| 2013/0026466 A1* | 1/2013 | Pagani | H01L 24/05 257/E23.179 |
| 2014/0167286 A1* | 6/2014 | Ochiai | H01L 23/53228 257/774 |
| 2015/0200146 A1* | 7/2015 | Reber | H01L 22/34 438/18 |

* cited by examiner

SEMICONDUCTOR DEVICE AND METHOD OF FORMING THE SAME

BACKGROUND

Recently, to improve the density of semiconductor devices such as dynamic random-access memory, increased chip area is being attained by reducing the size of scribe lines. Test elements for measuring the electrical performance of the circuit elements used in a semiconductor circuit are disposed on the scribe lines, but if pad electrodes on which a probe lands for measurement are disposed inside the scribe lines, the pad electrodes impede the reduction of the scribe lines. Consequently, the pad electrodes for measuring the test elements are disposed inside the chips.

BRIEF DESCRIPTION OF THE DRAWINGS

FIGS. 8A and 9A are plan views illustrating an example of the schematic configuration in exemplary process stages. FIGS. 8B and 9B are longitudinal sections illustrating the schematic configuration of a portion along the line G-G in FIGS. 8A and 9A. FIGS. 8C and 9C are longitudinal sections illustrating the schematic configuration of a portion along the line H-H in FIGS. 8A and 9A.

DETAILED DESCRIPTION

Figure 1:
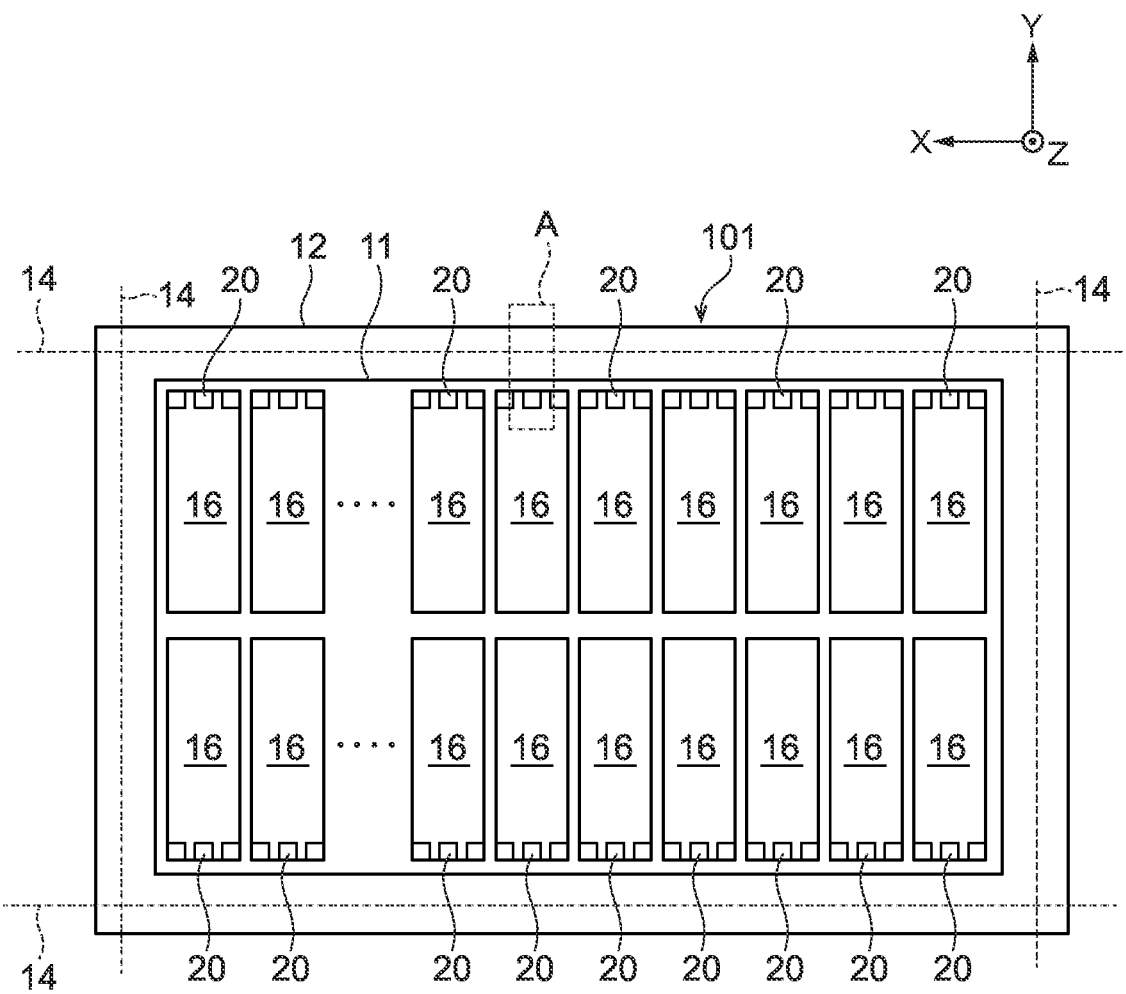
FIG. 1 is a plan view illustrating a schematic configuration of a semiconductor device according to an embodiment.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Hereinafter, a semiconductor device and a method of forming the same according to the embodiments will be described with reference to the drawings. In the following description, dynamic random-access memory (hereinafter referred to as DRAM) is given as an example of the semiconductor device. In the following description, the semiconductor device is also referred to as a semiconductor chip. In the description of the plurality of embodiments, common or related elements or elements that are substantially the same are denoted with the same signs or names, and the description thereof will be reduced or omitted. In the drawings described hereinafter, the dimensions and dimensional ratios of each unit in each of the drawings do not necessarily match the actual dimensions and dimensional ratios in the embodiments, unless specifically noted otherwise. In the following description, the Z direction is the direction perpendicular to the X-Y plane defined as the plane of a semiconductor substrate, and the direction in which the semiconductor substrate exists may be referred to as the downward or lower direction, while the reverse direction may be referred to as the upward or higher direction in some cases.

First Embodiment

Hereinafter, a semiconductor device according to the first embodiment will be described.

As illustrated in FIG. 1, the planar shape of the semiconductor device 101 is substantially rectangular. The semiconductor device 101 is disposed on a semiconductor substrate described later. The semiconductor device illustrated in FIG.

1 is an enlarged view of one semiconductor device 101 from among a plurality of semiconductor devices formed on a semiconductor wafer not illustrated.

The semiconductor device 101 is provided with a plurality of memory mats 16 in an active region 11 provided on the semiconductor substrate. The memory mats 16 are disposed in a matrix on the surface of the semiconductor device 101. The active region 11 is surrounded by a scribe region 12. The central part of the scribe region 12 is a dicing part 14, and the semiconductor substrate is divided into a plurality of semiconductor chips by cutting in the dicing part 14 later.

A plurality of ODP (on Die Param) pad electrodes 20 are disposed at the edges of the semiconductor device 101. The plurality of ODP pad electrodes 20 are disposed in the active region 11 of the semiconductor device 101, and are arranged in a straight line along the outer edge of the active region 11.

Figure 2:
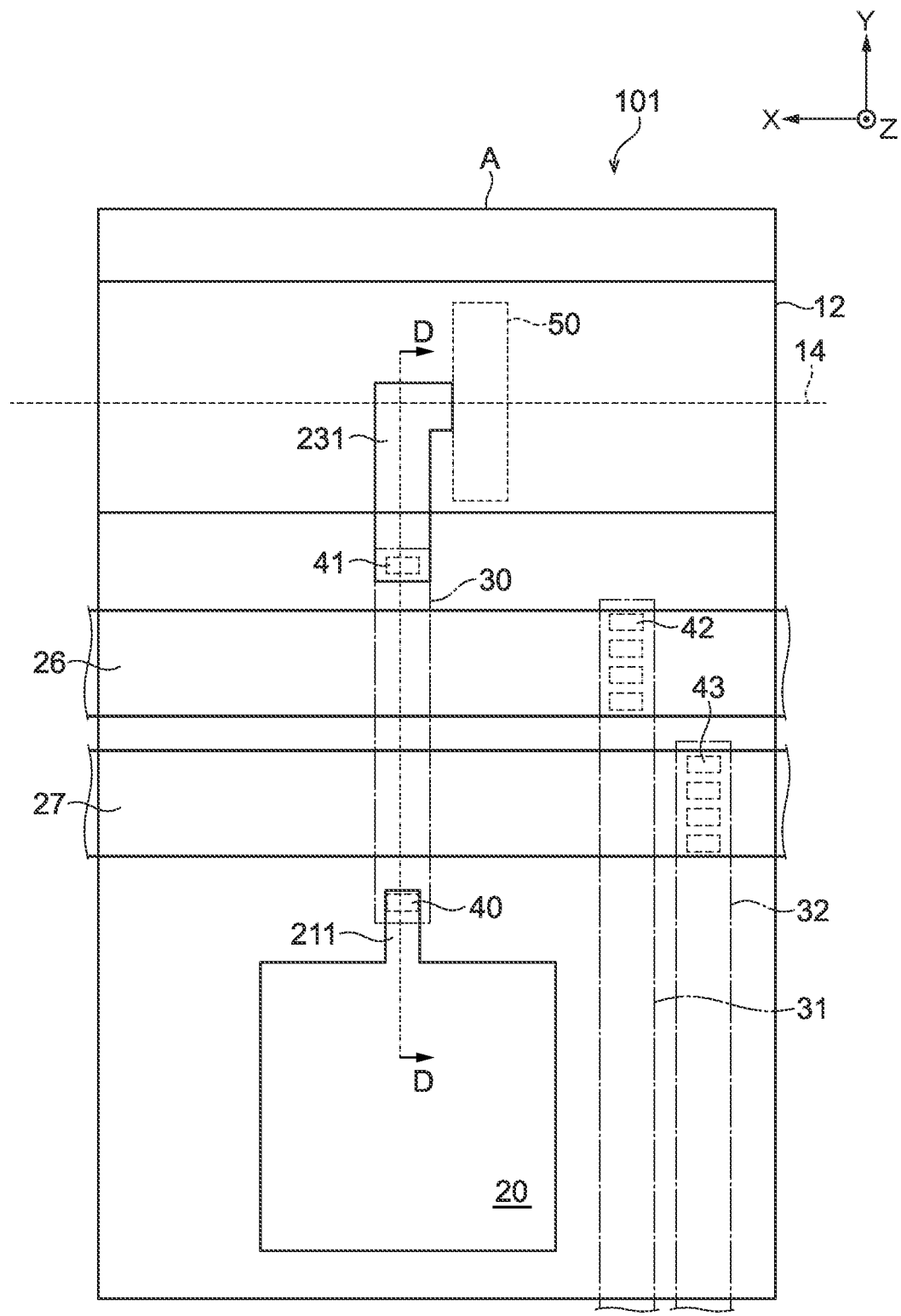
FIG. 2 is a diagram illustrating an enlarged schematic configuration of a portion of the semiconductor device according to a first embodiment, and is an enlarged plan view of the region A in FIG. 1.

As illustrated in FIG. 2, in the region A of FIG. 1, an ODP pad electrode 20, connection wiring 211 drawn out from the ODP pad electrode 20, a contact 40 that connects the connection wiring 211 to a wiring portion 30 of a lower wiring layer, and a contact 41 that connects the wiring portion 30 of the lower wiring layer to metal wiring 231. The metal wiring 231 leads to the scribe region 12, and a test component 50 is connected to the metal wiring 231. The test component 50 includes a test element for measuring the electrical performance of the circuit elements used in a semiconductor circuit. Between the metal wiring 231 and the connection wiring 211, power supply wirings 26 and 27 are disposed extending in the X direction. The wiring portion 30 of the lower wiring layer, which connects the test component 50 and the ODP pad electrode 20 and which is disposed straddling the active region 11 and the scribe region 12, forms an interconnection structure that crosses the power supply wirings 26 and 27.

The power supply wirings 26 and 27 are used as power supply trunk lines, and is disposed along the outermost edge of the semiconductor device 101. Large currents flow through the power supply wirings 26 and 27, and therefore the power supply wirings 26 and 27 are formed to have a low resistance by, for example, widening or thickening the wiring. The power supply wirings 26 and 27 extend along the border between the active region 11 and the scribe region 12.

Figure 3:
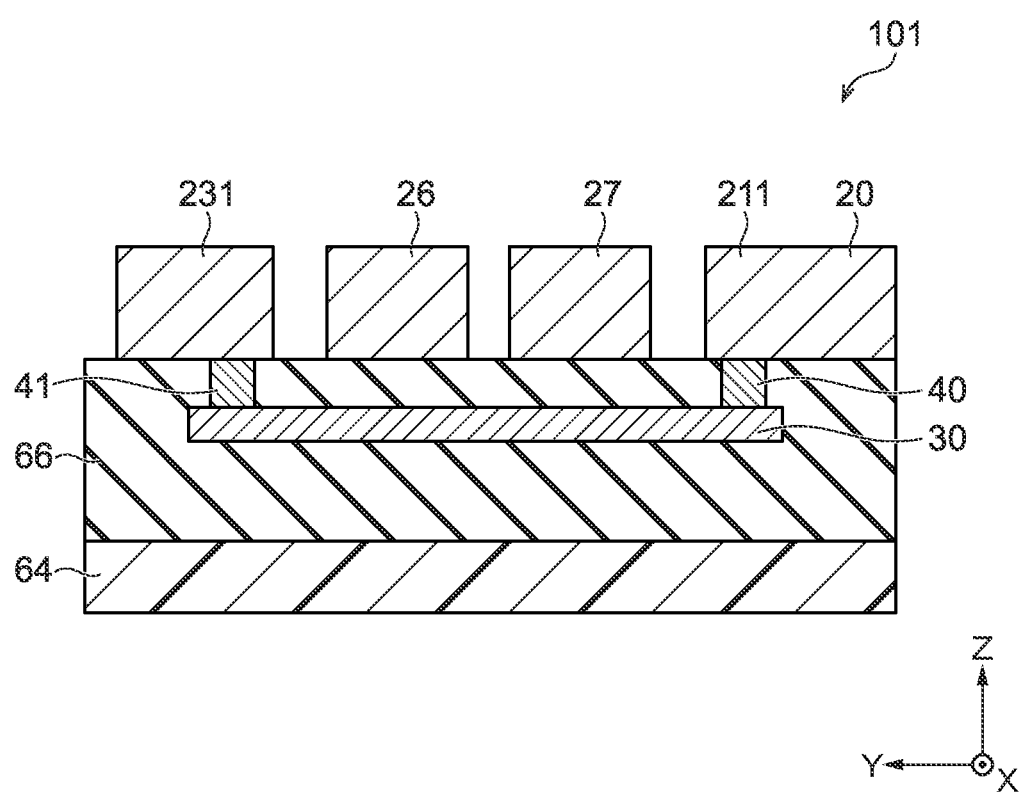
FIG. 3 is a diagram illustrating a schematic configuration of the semiconductor device according to the first embodiment, and is a longitudinal section illustrating the schematic configuration on the line D-D in FIG. 2.

As illustrated in FIG. 3, the semiconductor device 101 is provided with a semiconductor substrate 64 and an insulating film 66 disposed to cover the top of the semiconductor substrate 64. Also, in the semiconductor device 101, the wiring portion 30 of the lower wiring layer as well as the contacts 40 and 41 connected at either end of the wiring portion 30 of the lower wiring layer are provided inside the insulating film 66. The metal wiring 231 connected to the contact 40, the connection wiring 211 connected to the contact 41, and the ODP pad electrode 20 connected to the connection wiring 211 are disposed on top of the insulating film 66. The power supply wirings 26 and 27 are disposed on top of the insulating film 66, between the metal wiring 231 and the connection wiring 211.

The power supply wirings 26 and 27 are disposed on top of the insulating film 66, above the wiring portion 30 of the lower wiring layer. The connection wiring 211, the metal wiring 231, and the power supply wirings 26 and 27 include the upper wiring layer in the same layer. The power supply wirings 26 and 27 are disposed in the active region 11, and extend between the test component 50 and the ODP pad electrode 20. The power supply wirings 26 and 27 include a conductive layer above the wiring portion 30 of the lower wiring layer. The power supply wirings 26 and 27 are disposed directly above the wiring portion 30 of the lower wiring layer. The power supply wirings 26 and 27 are the wiring closest to the border between the active region 11 and the scribe region 12.

The semiconductor substrate 64 includes a disc-shaped single-crystal silicon wafer provided with a main surface that has been given a mirror finish, for example. The insulating film 66 contains silicon dioxide, for example. The wiring portion 30 of the lower wiring layer contains aluminum (Al), for example. The contact 40 and the contact 41 contain a metal. The connection wiring 211, the metal wiring 231, and the power supply wirings 26 and 27 contain aluminum, for example. The wiring portion 30 of the lower wiring layer includes a conductive film in a different layer from the connection wiring 211, the metal wiring 231, and the power supply wirings 26 and 27.

Figure 4:
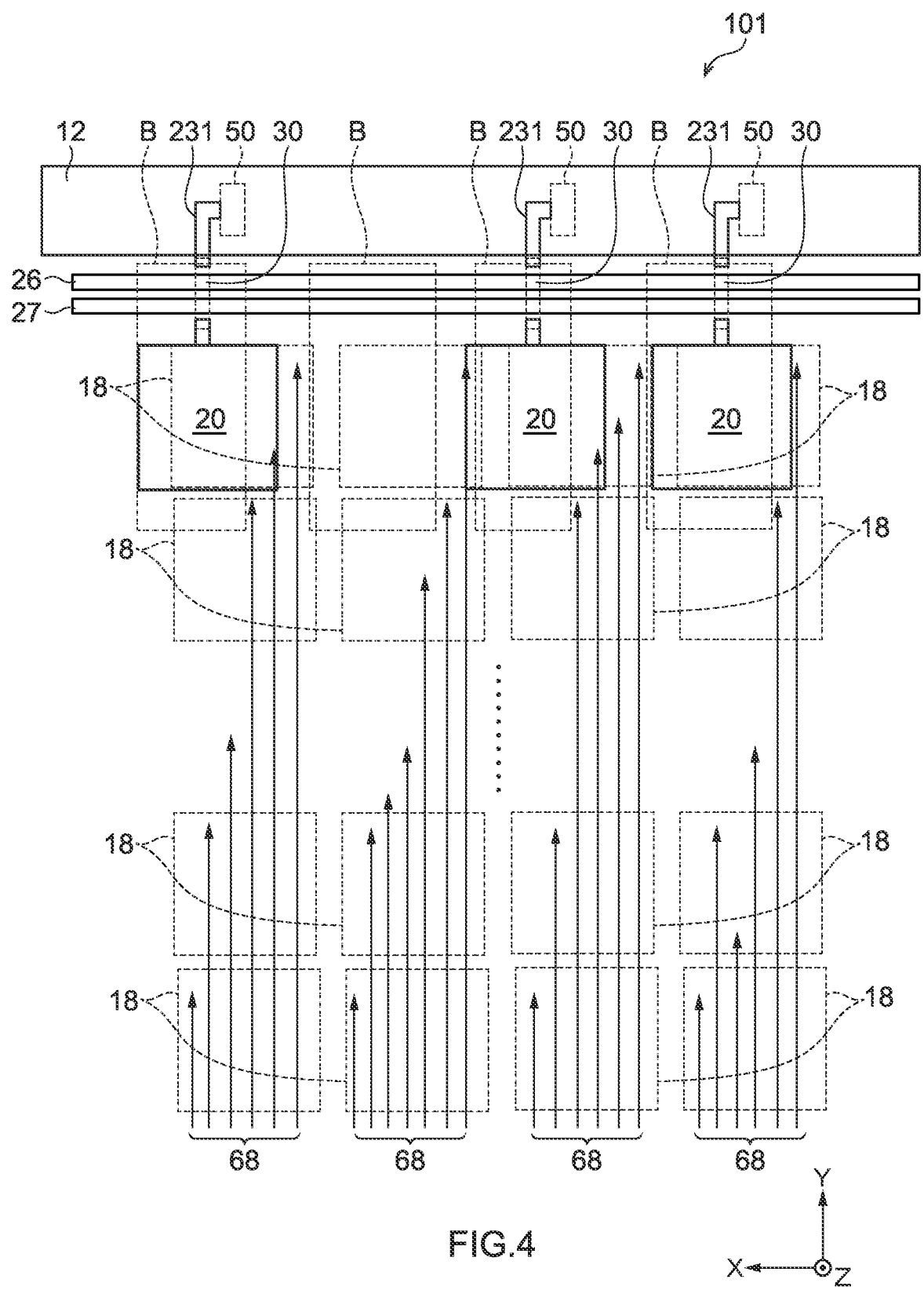
FIG. 4 is a diagram illustrating a schematic configuration of the semiconductor device according to the first embodiment, and is a plan view illustrating the schematic configuration of memory mats and a scribe region.

As illustrated in FIG. 4, the semiconductor device 101 is provided with a plurality of data lines 68 extending in the Y direction. The data lines 68 include signal lines that supply signals to sub-mats 18 disposed in the semiconductor device 101. The plurality of sub-mats 18 are included in the memory mats 16 illustrated in FIG. 1, and are arranged in a matrix inside the memory mats 16.

The data lines 68 are connected to a column decoder (YDEC) not illustrated, for example. The column decoder decodes column addresses and supplies a column select signal to each corresponding sub-mat 18 through the data lines 68. Each of the data lines 68 terminates at a destination sub-mat 18 to be supplied with a signal. The data lines 68 extend in a direction going from the center of the semiconductor device 101 toward the edge. Consequently, at the edge of the semiconductor device 101 in the Y direction, there are additional empty regions B where the data lines 68 do not exist. The ODP pad electrode 20s are disposed in these empty regions B.

The data lines 68 include a lower conductive layer provided below the wiring layer included in the power supply wirings 26 and 27 and the like. The data lines 68 include the same lower conductive layer as the wiring portion 30 of the lower wiring layer, for example. In the empty regions B, the same lower conductive layer as the data lines 68 can be used to form the wiring portion 30 of the lower wiring layer.

As described above, the power supply wirings 26 and 27 extend between the scribe region 12 and the ODP pad electrode 20. The metal wiring 231 connected to the test component 50 in the scribe region 12 is connected to the ODP pad electrode 20 through the wiring portion 30 of the lower wiring layer one level below, for example. However, the wiring portion 30 of the lower wiring layer is not limited to being one level below the power supply wirings 26 and 27, and may also be in a deeper wiring layer.

The power supply wirings 26 and 27, the ODP pad electrode 20, and the metal wiring 231 include the upper wiring layer in the same layer. Accordingly, the power supply wirings 26 and 27 can be disposed without having to avoid the wiring that connects the ODP pad electrode 20 to the scribe region 12. With this arrangement, because the power supply wirings 26 and 27 can be laid out without raising the resistance values of the power supply wirings 26 and 27, a high-performance semiconductor device 101 can be provided.

Second Embodiment

Next, a semiconductor device and a method of forming the same according to the second embodiment will be described with reference to FIG. 5, FIGS. 6A and 6B, FIGS. 7A, 7B, and 7C, FIGS. 8A, 8B, and 8C, FIGS. 9A, 9B, and 9C, FIG. 10, and FIG. 11.

Figure 5:
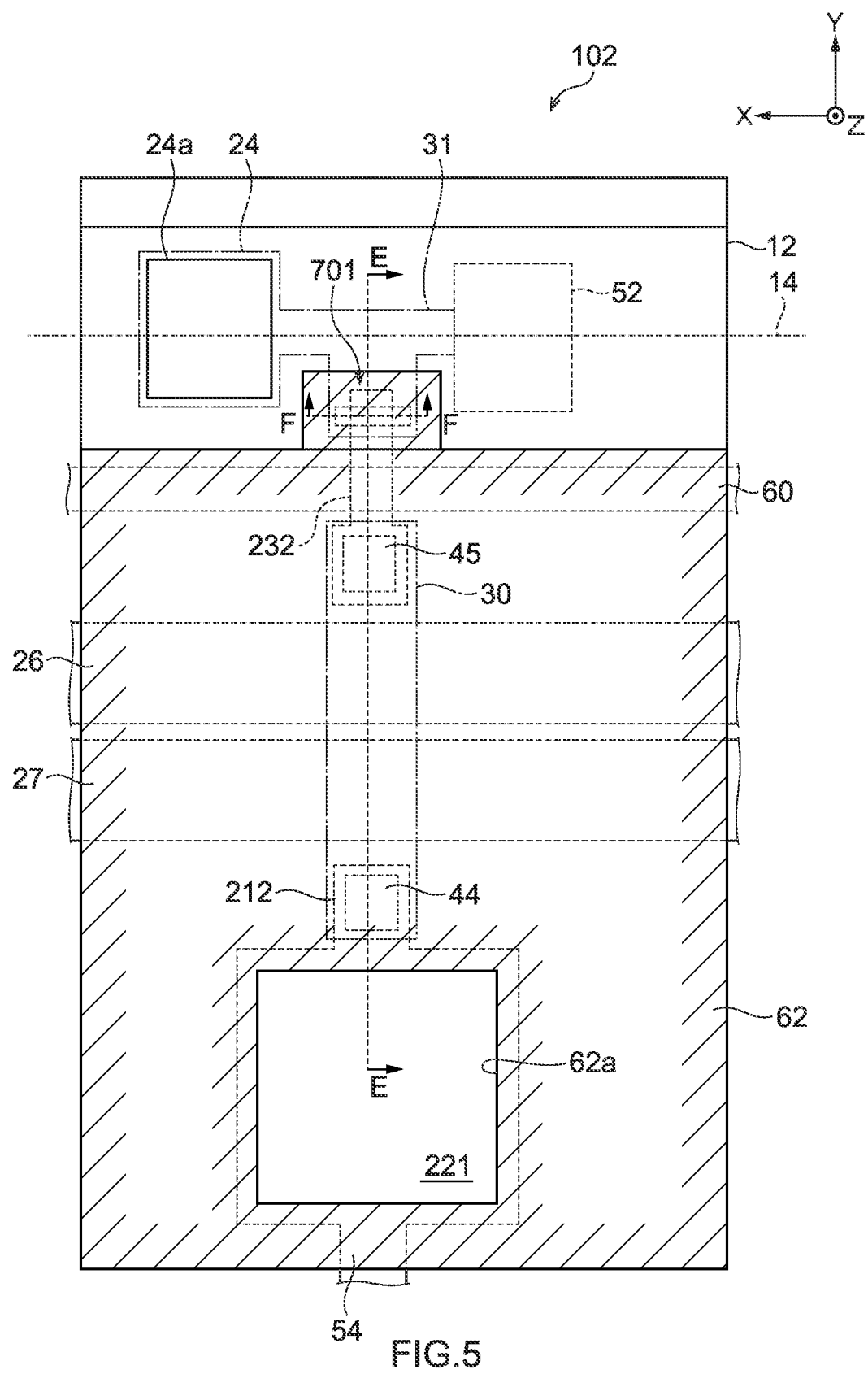
FIG. 5 is a diagram illustrating an enlarged schematic configuration of a portion of the semiconductor device according to a second embodiment, and corresponds to an enlarged plan view of the region A in FIG. 1.

As illustrated in FIG. 5, a semiconductor device 102 according to the second embodiment is provided with, in the active region 11, a bonding pad 221, connection wiring 212 connected to the bonding pad 221, a contact 44 that connects the connection wiring 212 to a wiring portion 30 of a lower wiring layer, and a contact 45 that connects the wiring portion 30 of the lower wiring layer to metal wiring 232. The metal wiring 232 extends to the scribe region 12.

Wiring 54 is connected to the bonding pad 221 on the opposite side from the connection wiring 212 in the Y direction. The wiring 54 is connected to various signal lines, for example. Note that the wiring 54 may be provided in some cases, even when using the bonding pad 221 as the ODP pad electrode 20 of the semiconductor device 101 according to the first embodiment.

The semiconductor device 102 is provided with, in the scribe region 12, a test component 52, lower wiring 31 connected to the test component 52, a TEG pad 24 connected to the lower wiring 31, and a fuse element 701. The lower wiring 31 includes the same wiring layer as the wiring portion 30 of the lower wiring layer. The test component 52 includes test elements referred to as a test element group (TEG) for measuring electrical properties and the like. The test component 52 also includes a test circuit for measuring the functional properties of an electronic circuit mounted on the semiconductor device 102.

The TEG pad 24 is electrically connected to the test component 52 through the lower wiring 31. The lower wiring 31 and the metal wiring 232 are connected at the fuse element 701. In other words, the fuse element 701 functions as a contact that connects the lower wiring 31 and the metal wiring 232. As described later, after the fuse element 701 is electrically blown, the metal wiring 232 and the lower wiring 31 are physically severed, and the electrical connection is broken. In this way, the fuse element 701 is disposed between the wiring portion 30 of the lower wiring layer and the test component 52, and is capable of breaking the electrical connection between the bonding pad 221 and the test component 52.

In the semiconductor device 102, the active region 11 is surrounded by the scribe region 12. The power supply wirings 26 and 27 extend between the scribe region 12 and the bonding pad 221. The metal wiring 232 connected to the test component 52 in the scribe region 12 is connected to the bonding pad 221 through the wiring portion 30 of the lower wiring layer in a lower layer.

The bonding pad 221 disposed in the active region 11 and the test component 52 disposed in the scribe region 12 are connected through the wiring portion 30 of the lower wiring layer disposed below the power supply wirings 26 and 27. The power supply wirings 26 and 27, the bonding pad 221, and the metal wiring 232 include the upper wiring layer in the same layer.

On the outermost periphery of the active region 11, a guard ring 60 is provided along the outer edge of the active region 11. The guard ring 60 protects the active region 11 against the intrusion of moisture from the outside and physical shocks.

In the semiconductor device 102, the active region 11, including the power supply wirings 26 and 27, and also the fuse element 701 are covered by a cover film 62. An opening 62a in the cover film 62 is provided above the bonding pad 221, leaving the top surface of the bonding pad 221 exposed through the opening 62a. By placing a probe on the bonding pad 221, the bonding pad 221 and the probe are electrically connected, thereby making it possible to pass a predetermined current to the bonding pad 221.

In the scribe region 12, the tops of the TEG pad 24, the test component 52, and the lower wiring 31 are covered by an insulating film. An opening 24a in the insulating film is provided above the TEG pad 24, leaving the top surface of the TEG pad 24 exposed through the opening 24a. The top surface of the TEG pad 24 is exposed through the opening 24a. By placing a probe on the TEG pad 24, the TEG pad 24 and the probe are electrically connected, thereby making it possible to pass a predetermined current to the TEG pad 24.

Figure 6A:
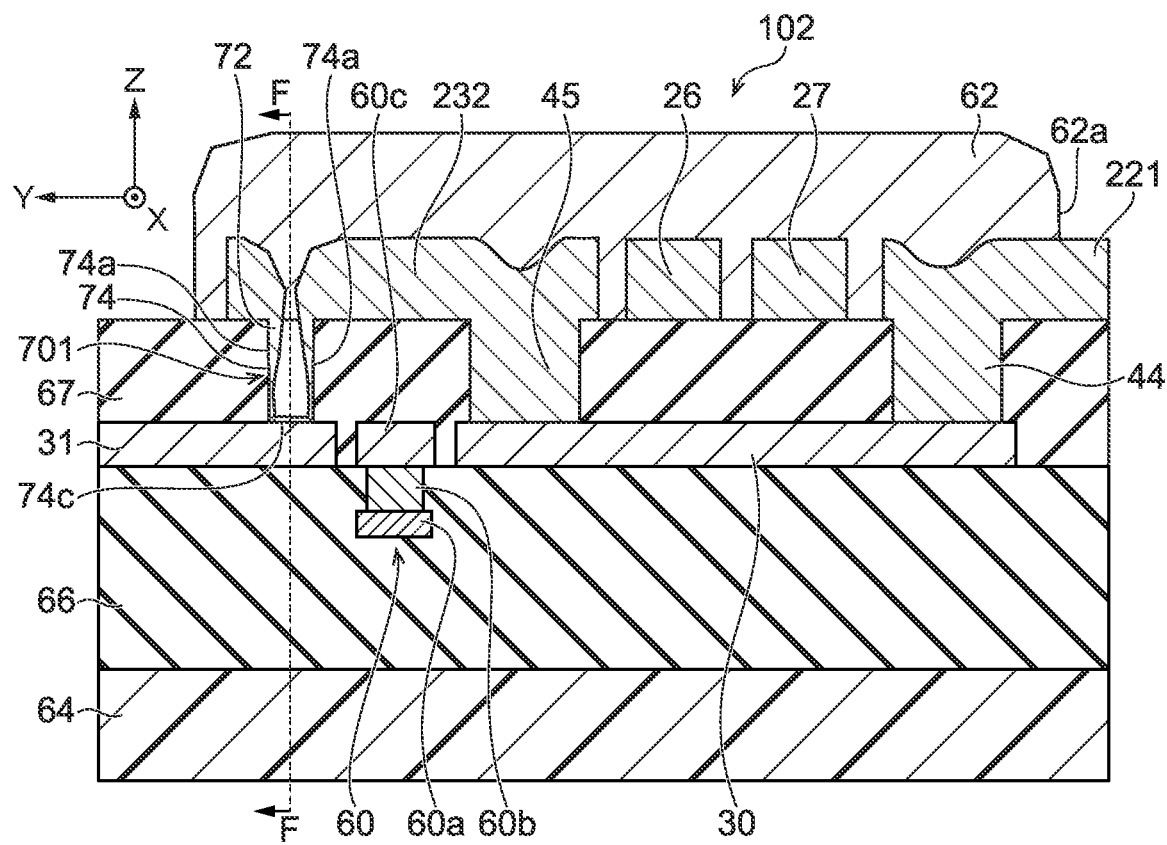
FIG. 6A is a diagram illustrating a schematic configuration of the semiconductor device according to the second embodiment, and is a longitudinal section illustrating the schematic configuration on the line E-E in FIG. 5.
Figure 6B:
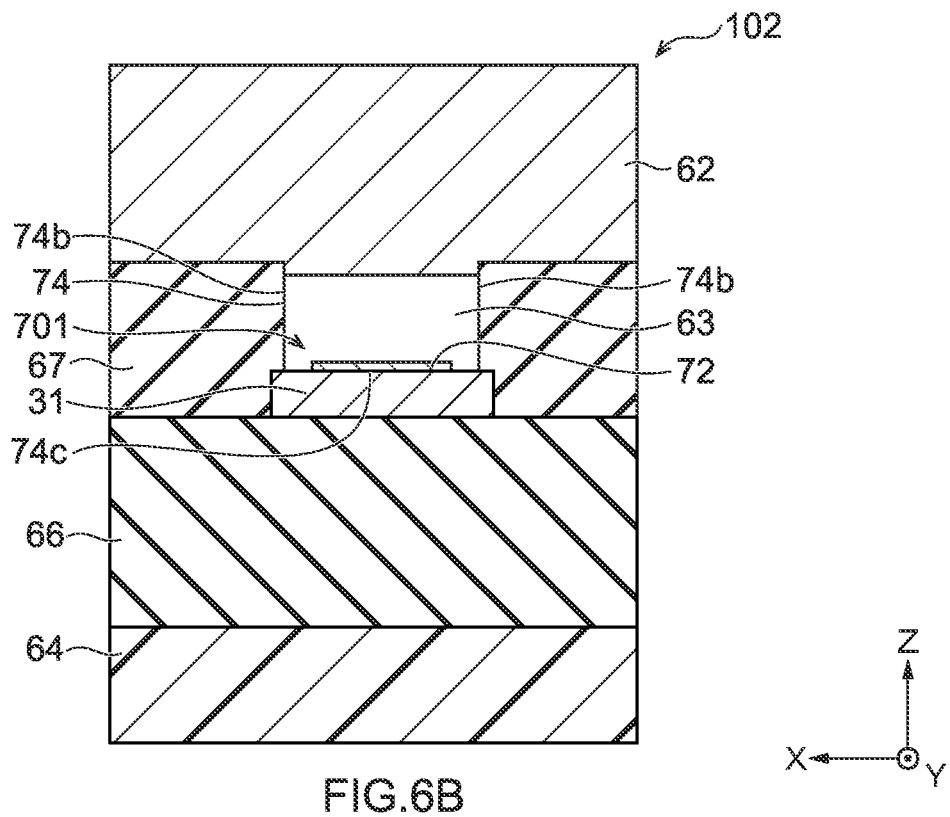
FIG. 6B is a diagram illustrating a schematic configuration of the semiconductor device according to the second embodiment, and is a longitudinal section illustrating the schematic configuration on the line F-F in FIG. 5. The lines E-E and F-F are at a right angle to each other.

As illustrated in FIGS. 6A and 6B, the semiconductor device 102 is provided with the semiconductor substrate 64, the insulating film 66 provided on top of the semiconductor substrate 64, and the wiring portions 30 and 31 of the lower wiring layer and the guard ring 60 on top of the insulating film 66. The guard ring 60 is provided with a first portion 60a, a second portion 60b, and a third portion 60c disposed in the vertical direction, for example. The first portion 60a, the second portion 60b, and the third portion 60c include a conductive material, for example. In this case, the wiring portion 30 of the lower wiring layer, the lower wiring 31, and the third portion 60c are included in the same wiring layer.

An insulating film 67 is provided on top of the wiring portions 30 and 31 of the lower wiring layer and the guard ring 60. The bonding pad 221, the metal wiring 232, and the power supply wirings 26 and 27 provided between the bonding pad 221 and the metal wiring 232 are disposed on top of the insulating film 67. The bonding pad 221 and the wiring portion 30 of the lower wiring layer are connected through the contact 44. The metal wiring 232 and the wiring portion 30 of the lower wiring layer are connected through the contact 45.

As illustrated in FIG. 5 and FIGS. 6A and 6B, the fuse element 701 is provided inside a fuse contact hole 74, which is an opening provided in the insulating film 67. Here, the sides on either end of the fuse contact hole 74 in the Y direction are referred to as the X-direction sides 74a, while the sides on either end of the fuse contact hole 74 in the X direction are referred to as the Y-direction sides 74b. The dimension of the fuse contact hole 74 in the Y direction is shorter than the dimension in the X direction. A metal thin film 72 is provided on a portion of a floor 74c as well as on the X-direction sides 74a of the fuse contact hole 74. The floor 74c is positioned on the top surface of the lower wiring 31.

The metal thin film 72 is not provided on the Y-direction sides 74b of the fuse contact hole 74. The region enclosed between the X-direction sides 74a and the Y-direction sides 74b of the fuse contact hole 74 is a cavity 63. On the surface of the semiconductor device 102, the bonding pad 221, the power supply wirings 26 and 27, the metal wiring 232, and the fuse element 701 are covered by the cover film 62. An opening 62a in the cover film 62 is provided above the bonding pad 221, leaving the top surface of the bonding pad 221 exposed through the opening 62a.

As described later, the bonding pad 221, the power supply wirings 26 and 27, the metal wiring 232, and the metal thin film 72 are formed in the same processing step and include the same upper wiring layer. The thickness of the metal thin film 72 inside the fuse contact hole 74 is thinner than the thickness of the bonding pad 221, the power supply wirings 26 and 27 and the metal wiring 232 outside the fuse contact hole 74. The electrical resistance of the metal thin film 72 in the fuse contact hole 74 is greater than the electrical resistance of the bonding pad 221, the power supply wirings 26 and 27, and the metal wiring 232. Consequently, when a current runs through the fuse element 701, the metal thin film 72 can be ruptured by melting, thereby breaking the electrical connection.

Next, FIGS. 6A and 6B to FIGS. 9A, 9B, and 9C will be referenced to describe a method of forming the fuse element 701 of the semiconductor device 102 according to the second embodiment.

Figure 7A:
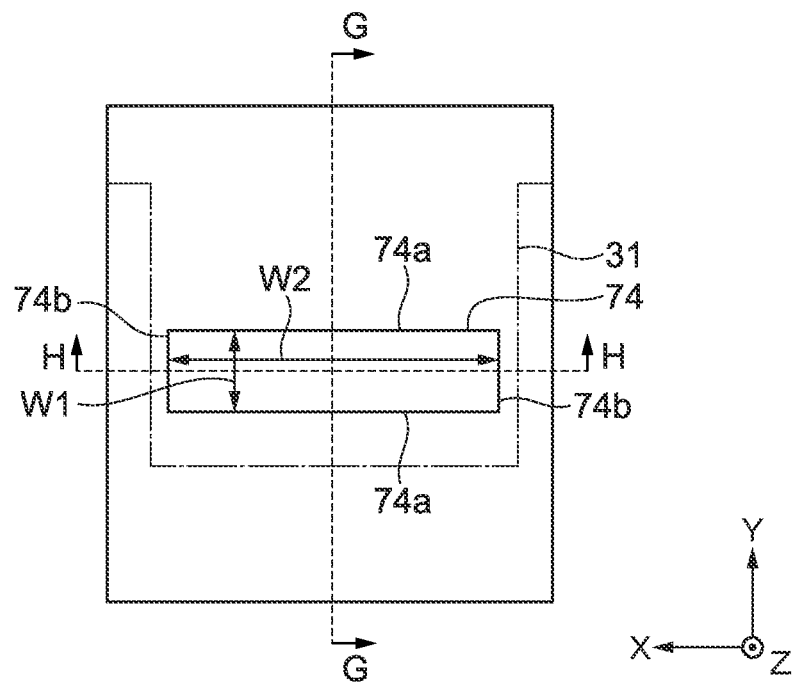
FIG. 7A is a diagram illustrating a schematic configuration of the semiconductor device according to the second embodiment, and is an enlarged plan view illustrating the schematic configuration of the fuse element in FIG. 5.
Figure 7B:
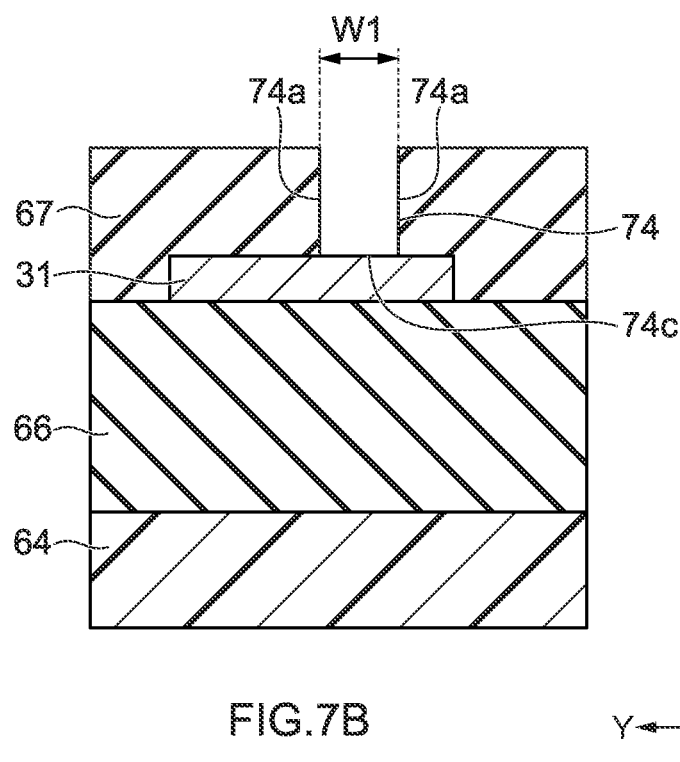
FIG. 7B is a diagram illustrating a schematic configuration of the semiconductor device according to the second embodiment, and is a longitudinal section illustrating the schematic configuration on the line G-G in FIG. 7A.
Figure 7C:
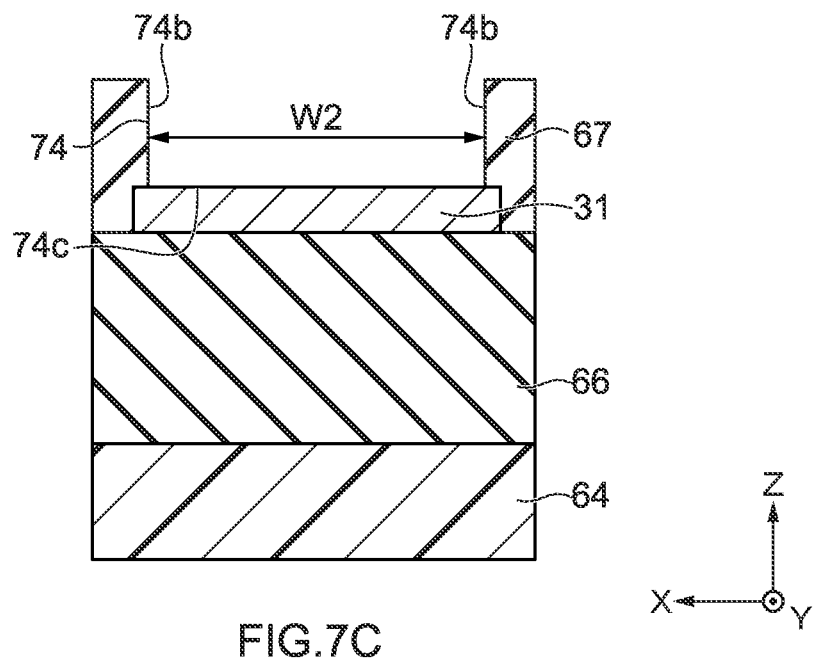
FIG. 7C is a diagram illustrating a schematic configuration of the semiconductor device according to the second embodiment, and is a longitudinal section illustrating the schematic configuration on the line H-H in FIG. 7A. The lines G-G and H-H are at a right angle to each other.

First, as illustrated in FIGS. 7A, 7B, and 7C, the insulating film 66 on the semiconductor substrate 64, the lower wiring 31 patterned on top of the insulating film 66, and the insulating film 67 covering the insulating film 66 and the lower wiring 31 are formed. Next, the fuse contact hole 74 is formed as a hole penetrating through the insulating film 67. The top surface of the lower wiring 31 is exposed at the floor of the fuse contact hole 74. The insulating film 66 and the insulating film 67 contain silicon dioxide for example, and are formed by CVD, for example. As described later, the fuse element 701 is formed inside the fuse contact hole 74.

The lower wiring 31 contains aluminum (Al) for example, and is formed by sputtering or CVD, for example. Thereafter, the lower wiring 31 is patterned by using known lithography techniques and anisotropic dry etching. The wiring portion 30 of the lower wiring layer and the third portion 60c illustrated in FIG. 6A and the like are formed in the same processing step as the lower wiring 31.

The fuse contact hole 74 is patterned by using known lithography techniques and anisotropic dry etching. The fuse contact hole 74 includes the X-direction sides 74a and the Y-direction sides 74b. As illustrated in FIGS. 7A, 7B, and 7C, a dimension W1 of the fuse contact hole 74 in the Y direction is formed smaller than a dimension W2 of the fuse contact hole 74 in the X direction.

Figure 8A:
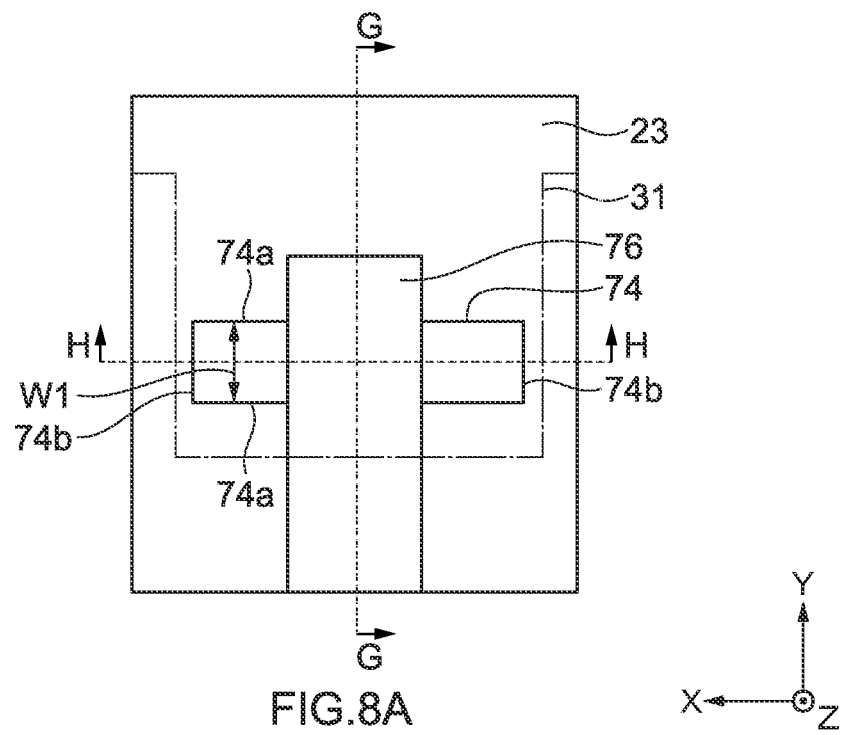
FIGS. 8A, 8B, 8C, 9A, 9B, and 9C are diagrams illustrating a method of forming the semiconductor device according to the second embodiment, and illustrate an example of the schematic configuration in exemplary process stages.
Figure 8B:
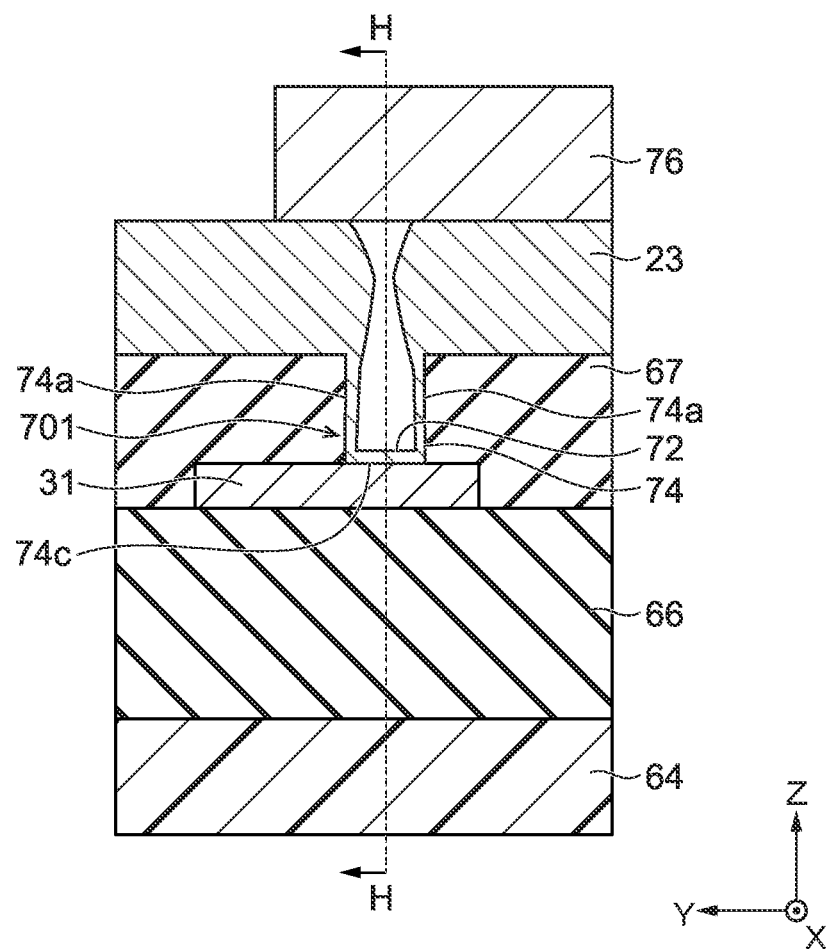
Figure 8C:
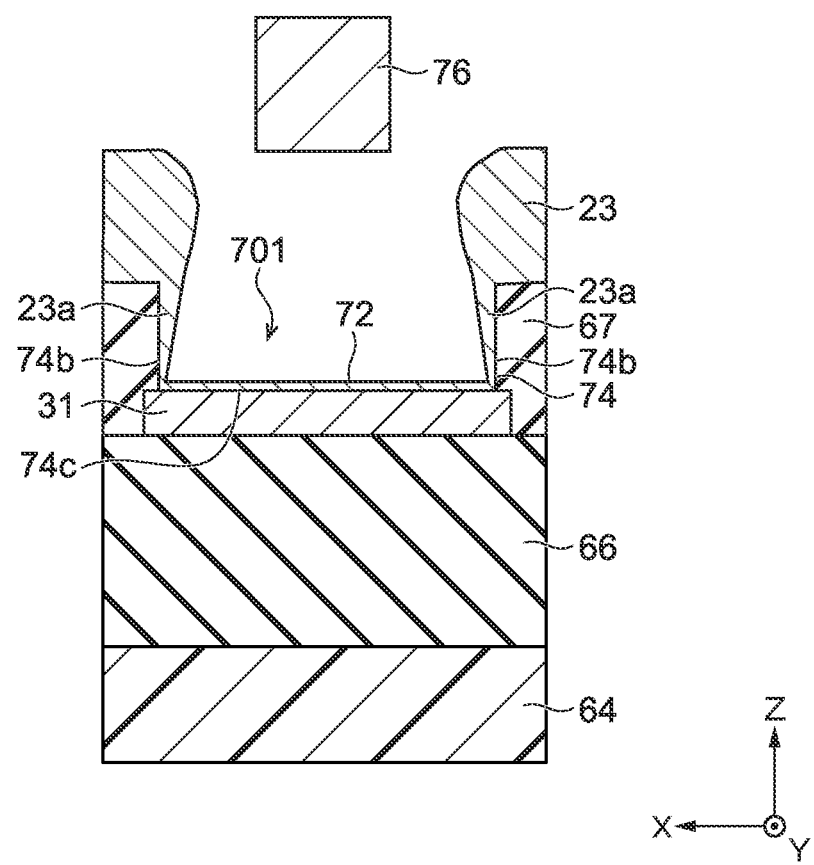

Next, as illustrated in FIGS. 8A, 8B, and 8C, a metal film 23 is formed on the top surface of the insulating film 67 so as to cover the floor 74c, the X-direction sides 74a, and the Y-direction sides 74b of the fuse contact hole 74. The metal film 23 contains aluminum and is formed by sputtering, for example. At this point, the dimension W1 of the fuse contact hole 74 in the Y direction is formed smaller than the dimension W2 of the fuse contact hole 74 in the X direction.

Sputtering is a film deposition method with poor step coverage of the film to be formed. For this reason, in the case of forming the metal film 23 by sputtering, the metal film 23 is not formed conformally inside the fuse contact hole 74, and the metal thin film 72 that is thinner compared to other regions is formed inside the fuse contact hole 74, namely on the X-direction sides 74a, the Y-direction sides 74b, and the floor 74c. Here, the metal film 23 may also be formed by CVD under conditions with poor step coverage.

Next, a patterned resist 76 is formed on the metal film 23. The resist 76 is formed to cover the fuse element 701 and the region where the metal wiring 232 is expected to be formed. The resist 76 is formed so as not to cover the X-direction sides 74a. The resist 76 is formed so as to cover a portion of the Y-direction sides 74b of the fuse contact hole 74. The resist 76 is patterned using known lithography techniques. Also, although not illustrated, the resist 76 is also formed on the bonding pad 221 formed at the same time as the resist 76, and on the regions where the power supply wirings 26 and 27 are expected to be formed.

Figure 9A:
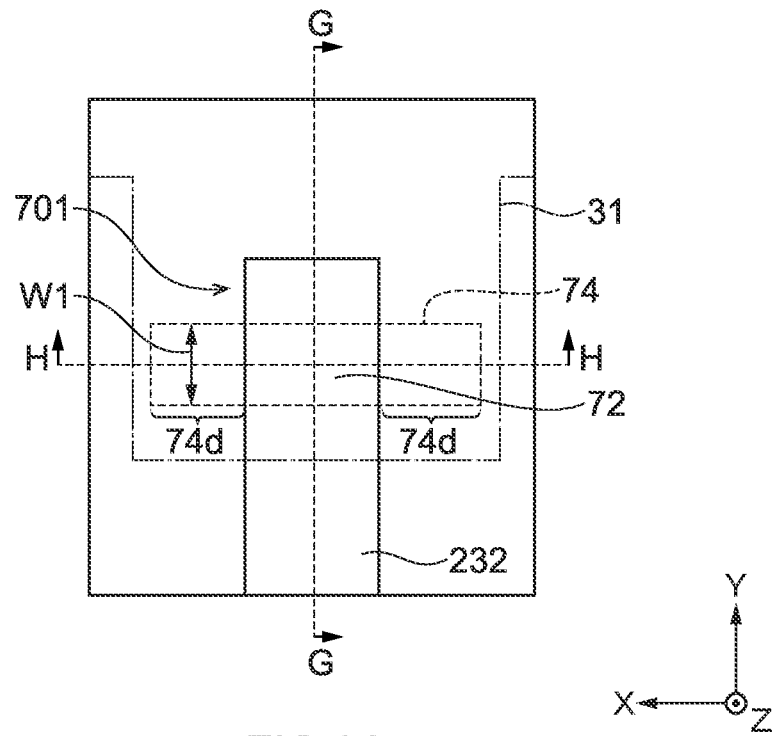
Figure 9B:
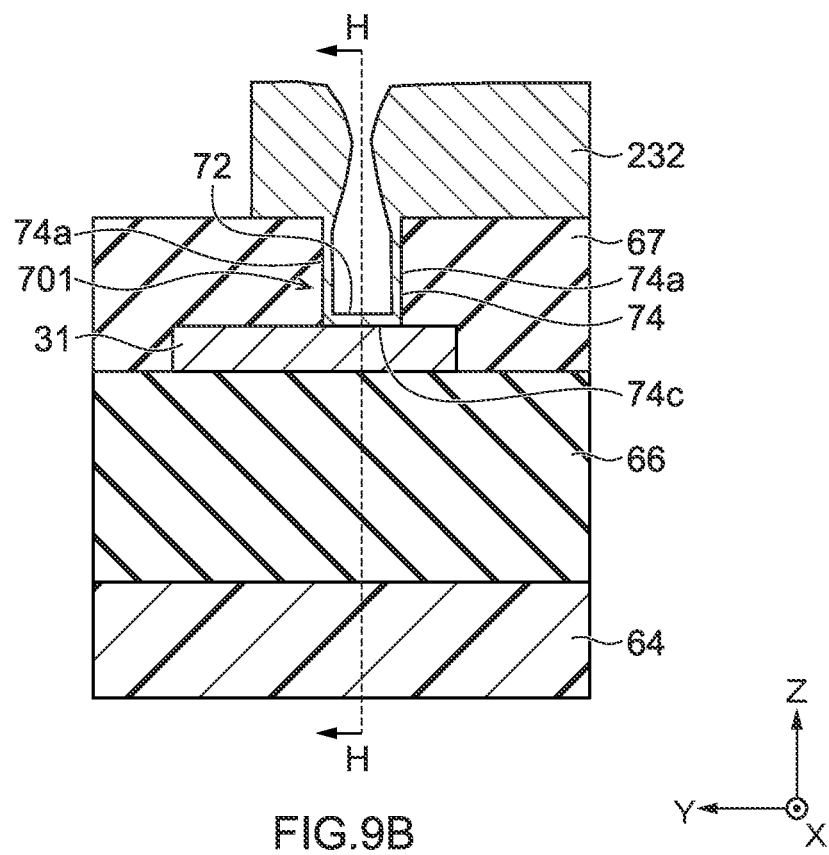
Figure 9C:
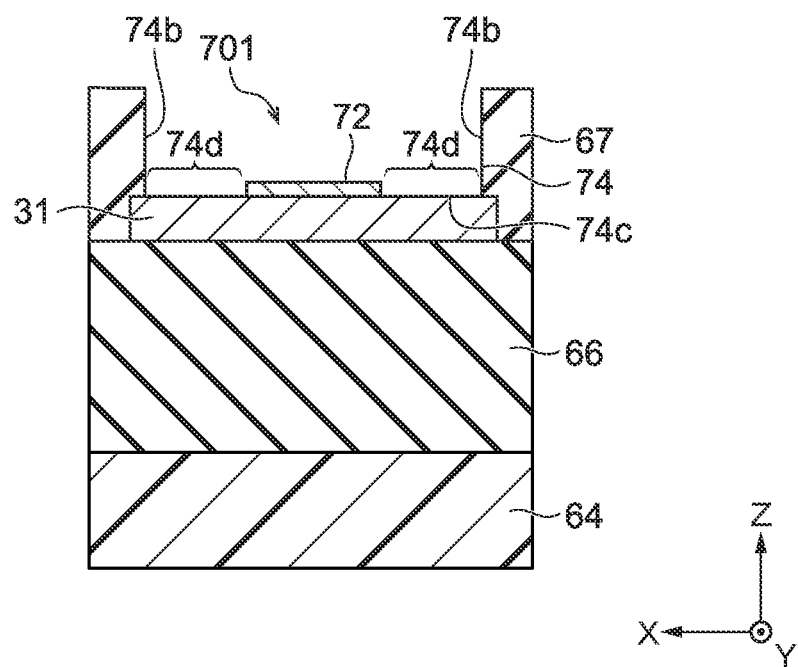

Next, as illustrated in FIGS. 9A, 9B, and 9C, the resist 76 is used as a mask to etch the metal film 23 by anisotropic dry etching. The metal film 23 underneath the resist 76 remains, thereby forming the metal wiring 232 and the metal thin film 72 of the fuse element 701. In the fuse element 701, the metal thin film 72 is not disposed in a region 74d on either side, in the X direction, of the metal thin film 72 on the floor 74c. The metal thin film 72 is disposed on the X-direction sides 74a and the central portion of the floor 74c.

Note that, although not illustrated, the bonding pad 221 and the power supply wirings 26 and 27 are also formed similarly. Next, the resist 76 is removed to form the structure illustrated in FIGS. 9A, 9B, and 9C.

Next, as illustrated in FIGS. 6A and 6B, the cover film 62 is formed on top of the bonding pad 221, the power supply wirings 26 and 27, the metal wiring 232, and the fuse element 701, and the opening 62a is formed in the cover film 62. Through the above steps, the semiconductor device 102 according to the second embodiment is formed. The cover film 62 contains polyimide, for example.

Figure 10:
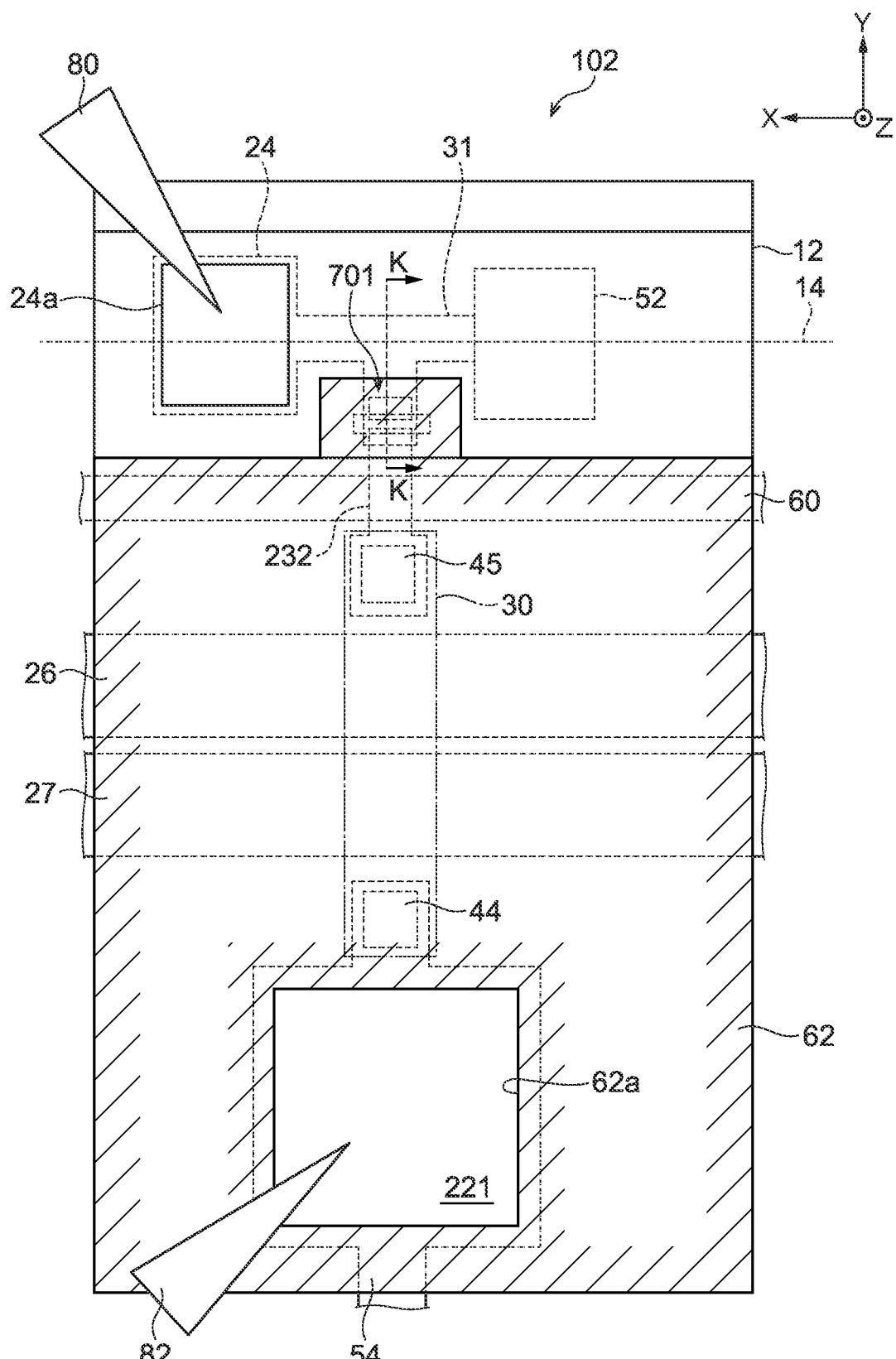
FIG. 10 is a diagram illustrating a schematic configuration of the semiconductor device according to the second embodiment, and is an enlarged plan view illustrating the schematic configuration after blowing the fuse element.
Figure 11:
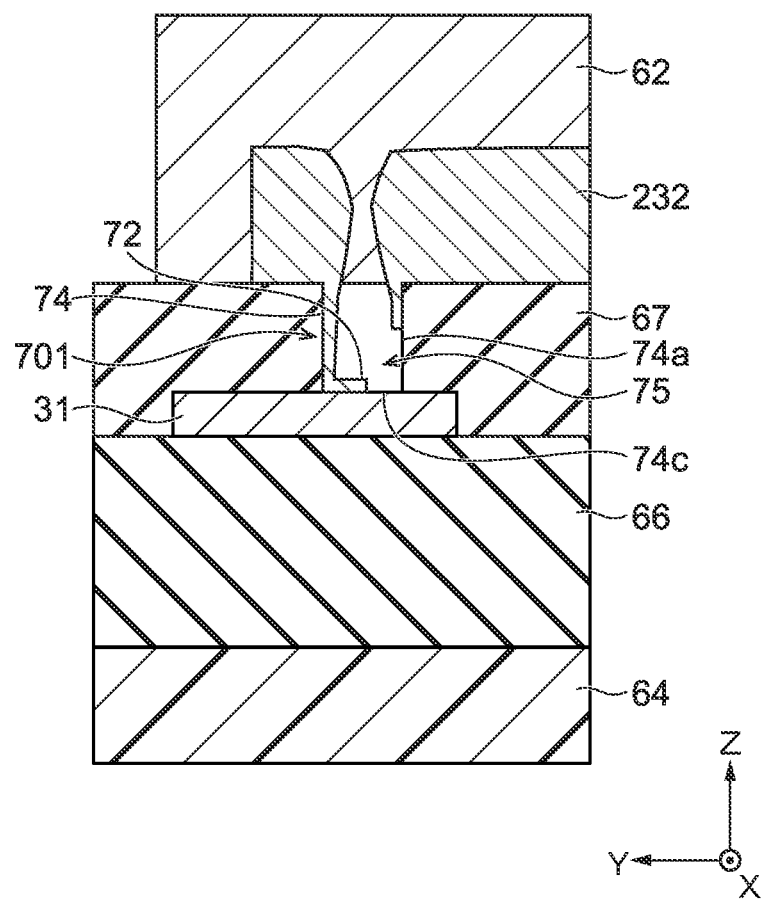
FIG. 11 is a diagram illustrating a schematic configuration of the semiconductor device according to the second embodiment, and is a longitudinal section illustrating the schematic configuration on the line K-K in FIG. 10.

Next, FIGS. 10 and 11 will be referenced to describe the blowing of the fuse element 701 in the semiconductor device 102 according to the second embodiment. Probes 80 and 82 are placed on the bonding pad 221 and the TEG pad 24. Next, a predetermined current is passed through the probes 80 and 82, which causes a current to flow through the fuse element 701. The probes 80 and 82 supply a current sufficient to rupture the metal thin film 72. The metal thin film 72 of the fuse element 701 has a high resistance value and is therefore ruptured and removed by the current, and a ruptured part 75 is formed on the X-direction sides 74a and the floor 74c. Due to the ruptured part 75, the metal wiring 232 and the lower wiring 31 are severed from each other both physically and electrically. As a result, the fuse element 701 is blown.

Thereafter, the wafer on which a plurality of semiconductor devices 102 are mounted is cut in the dicing part 14 to form individual semiconductor chips. The cut surfaces of components such as the lower wiring 31 are exposed on the cut surface of each semiconductor chip.

According to the semiconductor device 102 according to the second embodiment, effects similar to the effects exhibited by the semiconductor device 101 according to the first embodiment are obtained.

In addition, according to the semiconductor device 102 according to the second embodiment, the metal wiring 232 is physically severed in the fuse element 701. Consequently, even if moisture or chemicals intrude from the exposed lower wiring 31 on the side faces of the semiconductor chips, an intrusion that propagates along the metal wiring 232 and reaches the interior of the semiconductor device 102 can be suppressed. With this arrangement, a failure-resistant semiconductor device 102 can be provided.

Also, according to the semiconductor device according to the second embodiment, because the fuse element 701 is covered by the cover film 62, the intrusion of moisture or chemicals from the fuse element 701 can be suppressed. With this arrangement, a failure-resistant semiconductor device 102 can be provided.

Also, according to the method of forming a semiconductor device according to the second embodiment, the metal thin film 72 that corresponds to the electrode of the fuse element 701 is deposited under conditions with poor step coverage. Moreover, the fuse contact hole 74 is formed having a small dimension W1 in the Y direction and a small opening in the fuse contact hole 74. With this arrangement, the metal thin film 72 that is thinner than other regions can be formed on the sides and floor of the fuse contact hole 74. As the method of forming the metal thin film 72, sputtering or CVD performed under conditions of poor step coverage can be used. With this arrangement, the metal thin film 72 that is thinner than the metal wiring 232 on the insulating film 67 can be formed without adding a separate processing step.

Third Embodiment

Figure 12:
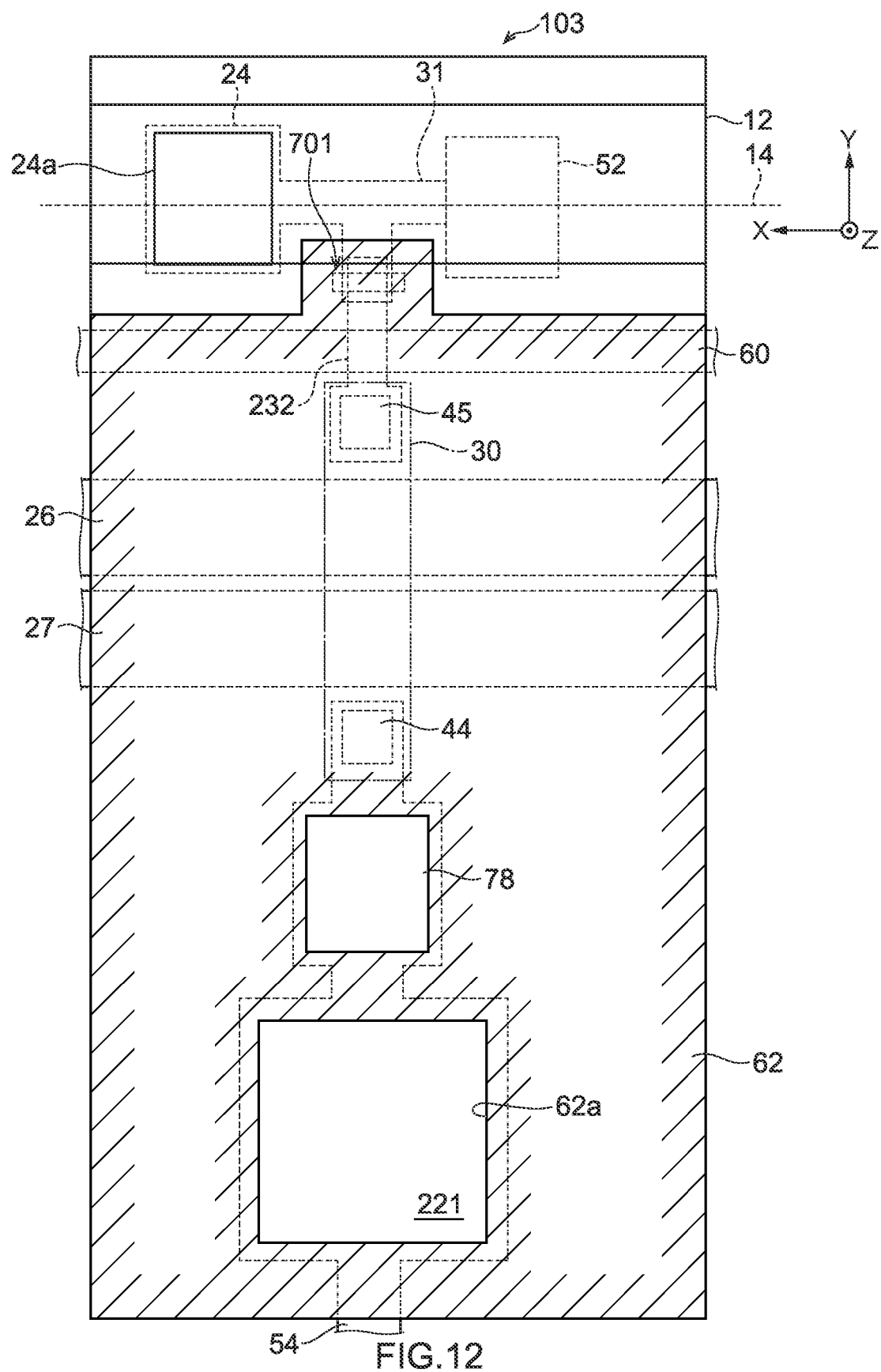
FIG. 12 is a diagram illustrating an enlarged schematic configuration of a portion of the semiconductor device according to a third embodiment, and corresponds to an enlarged plan view of the region A in FIG. 1.

Next, a semiconductor device 103 according to a third embodiment will be described with reference to FIG. 12.

The semiconductor device 103 according to the third embodiment differs from the semiconductor device 102 according to the second embodiment in that a probe pad 78 is provided between the bonding pad 221 and the contact 44. The probe pad 78 is provided with a structure similar to the bonding pad 221. The probe pad 78 includes the upper wiring layer in the same layer as the connection wiring 211, the metal wiring 231, and the power supply wirings 26 and 27. An opening in the cover film 62 is formed above the probe pad 78, leaving the top surface of the probe pad 78 exposed through the opening.

When blowing the fuse element 701, probes 80 and 82 like the ones illustrated in FIG. 10 are placed on the TEG pad 24 and the probe pad 78. Next, a predetermined current is passed through the probes 80 and 82, which causes a current to flow through the fuse element 701, thereby rupturing the fuse element 701 and causing the fuse element 701 to be blown. The rest of the configuration is similar to the semiconductor device 102 according to the second embodiment.

According to the semiconductor device 103 according to the third embodiment, effects similar to the effects exhibited by the semiconductor device 102 according to the second embodiment are obtained. According to the semiconductor device 103 according to the third embodiment, the probe pad 78 different from the bonding pad 221 is provided, and when blowing the fuse element 701, the probes 80 and 82 are placed on the TEG pad 24 and the probe pad 78.

With this arrangement, because a probe is not placed on the bonding pad 221 when blowing the fuse element 701, a probe mark is not left behind on the bonding pad 221. A bonding wire is connected to the bonding pad 221 afterward, and since a probe mark is not left behind, the occurrence of bond peeling on the bonding pad 221 can be reduced.

Fourth Embodiment

Figure 13A:
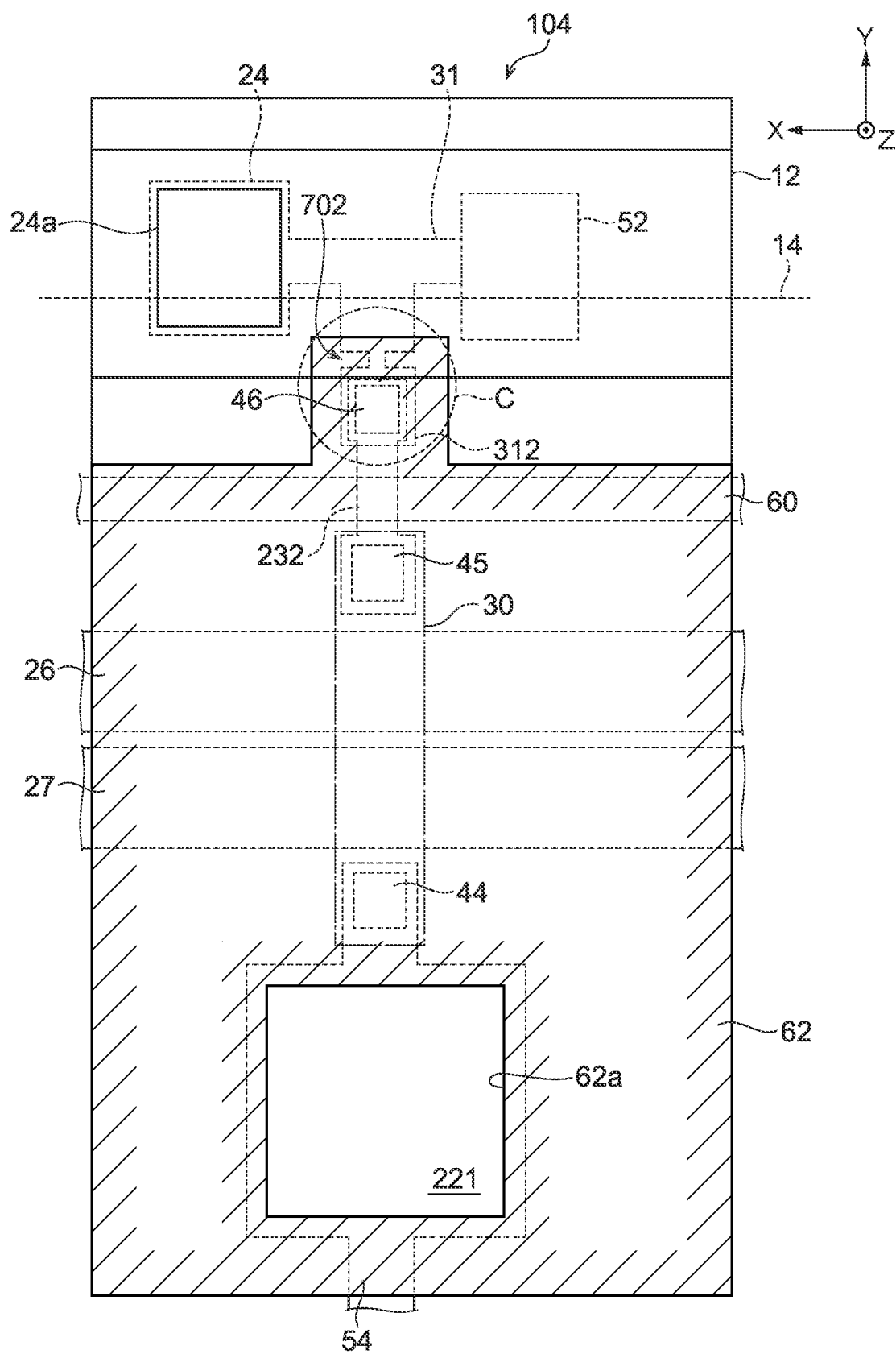
FIG. 13A is a diagram illustrating an enlarged schematic configuration of a portion of the semiconductor device according to a fourth embodiment, and corresponds to an enlarged plan view of the region A in FIG. 1.

Next, a semiconductor device 104 according to a fourth embodiment will be described with reference to FIGS. 13A and 13B.

The semiconductor device 104 according to the fourth embodiment differs from the semiconductor device 102 according to the second embodiment in that a fuse element 702 is formed by wiring of smaller width compared to other portions. The semiconductor device 104 according to the fourth embodiment also differs from the semiconductor device 102 according to the second embodiment in that the lower wiring 31 connected to the test component 52 is connected from the bonding pad 221 to contact portion wiring 312 through the contact 44, the wiring portion 30 of the lower wiring layer, the contact 45, the metal wiring 232, and a contact 46, and the fuse element 702 is provided between the contact portion wiring 312 and the lower wiring 31.

The fuse element 702, the contact portion wiring 312, and the lower wiring 31 include the same conductive layer as the wiring portion 30 of the lower wiring layer disposed underneath the power supply wirings 26 and 27. The rest of the configuration is the same as the semiconductor device 102 according to the second embodiment.

Figure 13B:
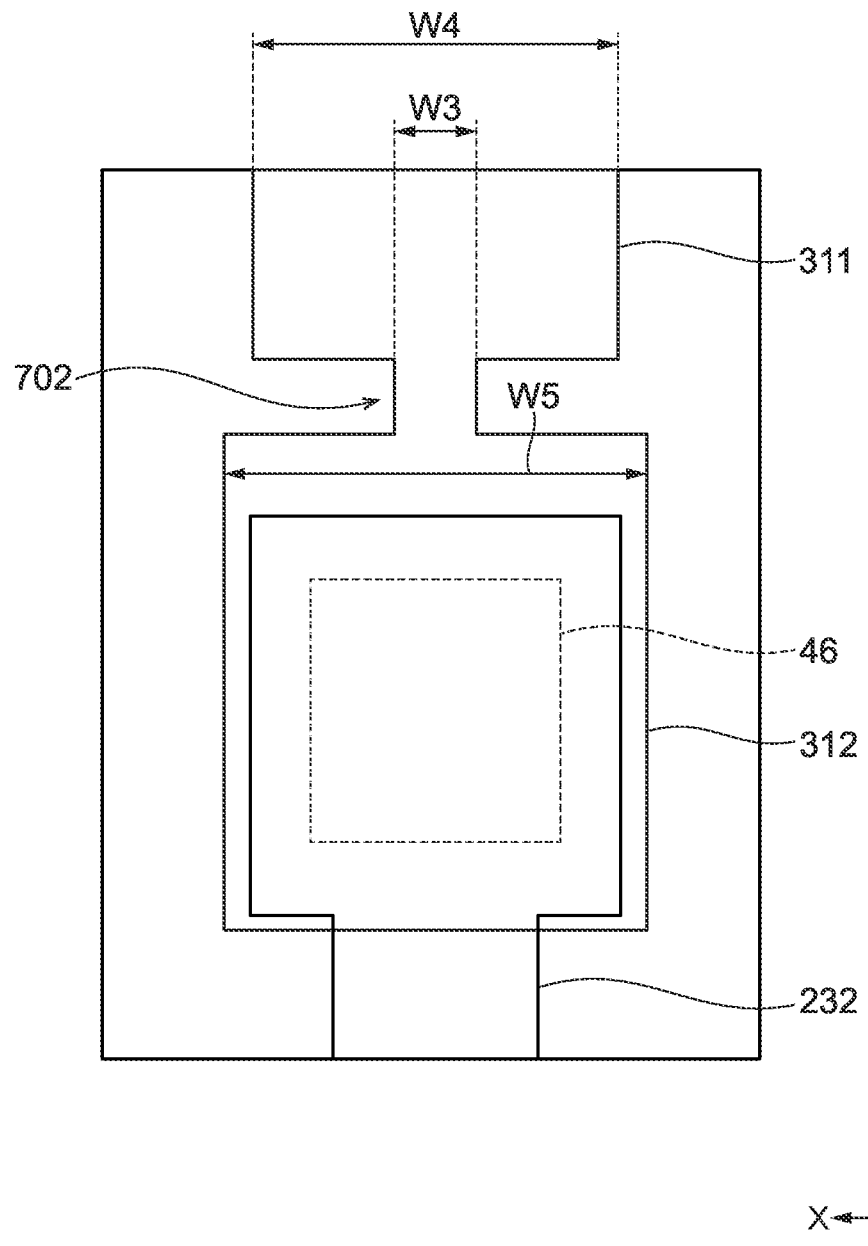
FIG. 13B is an enlarged plan view of the region C in FIG. 13A.

As illustrated in FIG. 13B, the width W3 of the fuse element 702 is smaller than the width W4 of a connecting part 311 connected to the fuse element 702. Also, the width W3 of the fuse element 702 is smaller than the width W5 of the contact portion wiring 312 connected to the fuse element 702. The widths W3, W4, and W5 are all dimensions in the X direction. By reducing the width W3 of the fuse element 702, a highly resistive fuse element 702 can be provided.

The fuse element 702 is blown by placing probes on the bonding pad 221 and the TEG pad 24 and passing a predetermined current through the probes, similarly to the second embodiment.

The semiconductor device 104 according to the fourth embodiment exhibits effects similar to the semiconductor device 102 according to the second embodiment.

As above, DRAM is described as an example of the semiconductor device according to the embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device. Furthermore, devices other than memory, including logic ICs such as a microprocessor and an application-specific integrated circuit (ASIC) for example are also applicable as the semiconductor device according to the foregoing embodiments.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
    an active region;
    a scribe region surrounding the active region;
    a test component in the scribe region;
    a pad electrode in the active region;
    a power supply wiring of an upper wiring layer in the active region, the power supply wiring extending between the test component and the pad electrode; and
    an interconnection structure configured to couple the test component and the pad electrode across a border between the active region and the scribe region, the interconnection structure including a wiring portion of a lower wiring layer crossing the power supply wiring, wherein the interconnection structure further includes a fuse element between the wiring portion and the test component, the fuse element being capable of breaking an electrical connection between the pad electrode and the test component when the fuse is blown, and wherein the fuse element is formed in a hole in the scribe region.

2. The apparatus of claim 1, wherein the upper wiring layer is directly above the lower wiring layer.

3. The apparatus of claim 1, wherein the power supply wiring extends along the border between the active region and the scribe region.

4. The apparatus of claim 3, wherein the power supply wiring is a closest wiring to the border between the active region and the scribe region.

5. The apparatus of claim 1, wherein the conductive material forming the fuse element is provided on a bottom surface and a side surface of the hole in a first direction, and is not provided on the side surface of the hole in a second direction different from the first direction.

6. The apparatus of claim 5, wherein a film thickness of the conductive material forming the fuse element is smaller in the hole than outside of the hole.

7. An apparatus comprising:
an active region;
a scribe region surrounding the active region;
a test component in the scribe region;
a pad electrode in the active region;
a power supply wiring of an upper wiring layer in the active region, the power supply wiring extending between the test component and the pad electrode; and
an interconnection structure configured to couple the test component and the pad electrode across a border between the active region and the scribe region, the interconnection structure including a wiring portion of a lower wiring layer crossing the power supply wiring, wherein the wiring portion of the lower wiring layer is provided inside an insulating film, and wherein the power supply wiring of the upper wiring layer is disposed on top of the insulating film, wherein the interconnection structure further includes a fuse element between the wiring portion and the test component, the fuse element being capable of breaking an electrical connection between the pad electrode and the test component when the fuse is blown, wherein the fuse element includes wiring having a width smaller than a width of a region coupled to the fuse element, wherein the region includes wiring.

8. An apparatus comprising:
an active region;
a scribe region surrounding the active region;
a test component in the scribe region;
a pad electrode in the active region;
a power supply wiring of an upper wiring layer in the active region, the power supply wiring extending between the test component and the pad electrode; and
an interconnection structure configured to couple the test component and the pad electrode across a border between the active region and the scribe region, the interconnection structure including a wiring portion of a lower wiring layer crossing the power supply wiring,
wherein the interconnection structure further includes a fuse element between the wiring portion and the test component, the fuse element being capable of breaking an electrical connection between the pad electrode and the test component when the fuse is blown, and wherein the pad electrode is a first pad electrode, the apparatus further comprising a second pad electrode in the scribe region and the fuse element is arranged between the first pad electrode and the second pad electrode.

9. The apparatus of claim 8, further comprising a third pad electrode coupled between the first pad electrode and the fuse element.

10. An apparatus comprising:
an active region;
a scribe region surrounding the active region;
a test component in the scribe region;
a pad electrode in the active region;
a power supply wiring of an upper wiring layer in the active region, the power supply wiring extending between the test component and the pad electrode;
an interconnection structure configured to couple the test component and the pad electrode across a border between the active region and the scribe region, the interconnection structure including a wiring portion of a lower wiring layer crossing the power supply wiring; and
a cover film covering at least the power supply wiring of an upper wiring layer, the pad electrode in the active region, and the fuse element in the scribe region, the cover film having an opening to expose an upper surface of the pad electrode,
wherein the interconnection structure further includes a fuse element between the wiring portion and the test component, the fuse element being capable of breaking an electrical connection between the pad electrode and the test component when the fuse is blown.

11. An apparatus comprising:
an active region;
a scribe region surrounding the active region;
a test component in the scribe region;
a first wiring connected to the test component in the scribe region;
a pad electrode in the active region;
a power supply wiring of an upper wiring layer in the active region, the power supply wiring extending between the test component and the pad electrode;
an interconnection structure coupling the test component and the pad electrode across a border between the active region and the scribe region, the interconnection structure including a wiring portion of a lower wiring layer crossing the power supply wiring;
a second wiring extending between the wiring portion and the test component; and
a contact connecting the first wiring and the second wiring in the scribe region, the contact including conductive material configured as a fuse element, the fuse element being capable of breaking an electrical connection between the pad electrode and the test component.

12. The apparatus of claim 11, wherein the upper wiring layer is directly above the lower wiring layer.

13. The apparatus of claim 11, wherein the power supply wiring extends along the border between the active region and the scribe region.

14. The apparatus of claim 11, wherein the power supply wiring is a closest wiring to the border between the active region and the scribe region.

15. The apparatus of claim 11, wherein the contact is provided in a hole and a film thickness of the conductive material forming the contact is smaller in the hole than outside of the hole.

16. The apparatus of claim 15, wherein the conductive material forming the contact is provided on a bottom surface and a side surface of the hole in a first direction, and is not provided on the side surface of the hole in a second direction different from the first direction.

17. The apparatus of claim 11, further comprising a third pad electrode electrically connected to the first wiring in the scribe region.

18. The apparatus of claim 11, further comprising a cover film covering at least the power supply wiring of an upper wiring layer and the pad electrode in the active region and the fuse element in the scribe region, the cover film having an opening to expose an upper surface of the pad electrode.

* * * * *